United States Patent [19]
Pham-Ngu

[11] 3,805,129
[45] Apr. 16, 1974

[54] FIELD EFFECT TRANSISTOR HAVING TWO GATES FOR FUNCTIONING AT EXTREMELY HIGH FREQUENCIES

[75] Inventor: Tung Pham-Ngu, Paris, France
[73] Assignee: Thomson-CSF, Paris, France
[22] Filed: Oct. 13, 1972
[21] Appl. No.: 297,394

[30] Foreign Application Priority Data
Oct. 29, 1971 France .............................. 71.39034

[52] U.S. Cl....... 317/235 R, 317/235 A, 317/235 G, 317/235 AJ
[51] Int. Cl. ............................................... H01l 5/00
[58] Field of Search ............... 317/235, 21, 22.2, 47

[56] References Cited
UNITED STATES PATENTS

| | | | |
|---|---|---|---|
| 3,678,573 | 7/1972 | Driver | 29/571 |
| 3,657,615 | 4/1972 | Driver | 317/235 |
| 3,274,461 | 9/1966 | Teszner | 317/235 |
| 3,597,287 | 8/1971 | Koepp | 148/187 |

*Primary Examiner*—Rudolph V. Rolinec
*Assistant Examiner*—E. Wojciechowicz
*Attorney, Agent, or Firm*—Cushman, Darby & Cushman

[57] ABSTRACT

A field effect transistor (F.E.T.), comprising two control gates disposed in side-by-side relationship and capable of being operated at frequencies higher than 1 GHz, is provided.

A gate $G_1$ is deposited at the bottom of a trench $T_1$, recessed in the F.E.T.'s semiconductive layer and connected to a contact stud $K_1$. It encloses the source S of the transistor and is surrounded, at a distance of the order of 10 microns, by a gate $G_2$ deposited at the bottom of a trench $T_2$ recessed in the F.E.T.'s semiconductive layer and connected to a contact stud $K_2$. The drain D of the transistor surrounds the trench $T_2$ and the stud $K_2$. The cross-section of the trenches is of the order of 1 micron by 1 micron.

4 Claims, 5 Drawing Figures

FIELD EFFECT TRANSISTOR HAVING TWO GATES FOR FUNCTIONING AT EXTREMELY HIGH FREQUENCIES

The invention relates to structures comprising at least one field effect transistor, having two gates disposed in the same plane parallel to that of the channel. Such structures are intended to function at an extremely high frequency (above 1 GHz) in particular as variable gain amplifiers.

The known devices are, practically speaking, limited to frequencies below 1 GHz, if there is utilised a "planar" conventional structure (gates in the same plane as the source and the drain), due to parasite resistances.

By depositing a gate at the bottom of a trench recessed in the layer in which the channel is to be formed, it becomes possible to achieve satisfactory functioning at frequencies exceeding 1 GHz.

The manufacturing process requires only one high-precision mask obtained by electron bombardment of a sensitive layer, development of the photographic type followed by etching:

In the case of a more complex structure comprising two gates and a connecting stud between the two gates, it becomes necessary to employ a plurality of high-precision masks.

The invention permits the mass production of a novel structure compatible with the requirement for a single masking structure.

The transistor according to the invention comprises two gates $G_1$ and $G_2$ formed respectively at the bottom of trenches $T_1$ and $T_2$ recessed in the layer in which the channel is to be formed and connected respectively to lateral contacts $K_1$ and $K_2$. The trench $T_1$ completely surrounds the source (or the drain) of the transistor. The trench $T_2$ completely surrounds the trench $T_1$ and a contact $K_1$. The trench $T_2$ and the contact $K_2$ are completely surrounded by the drain (or the source).

The notations given hereinbelow $G_1$, $G_2$ ... etc, are employed also in the description following hereinbelow, thus facilitating an understanding of the invention.

They are shown in the accompanying drawings, in which.

Figure 1:
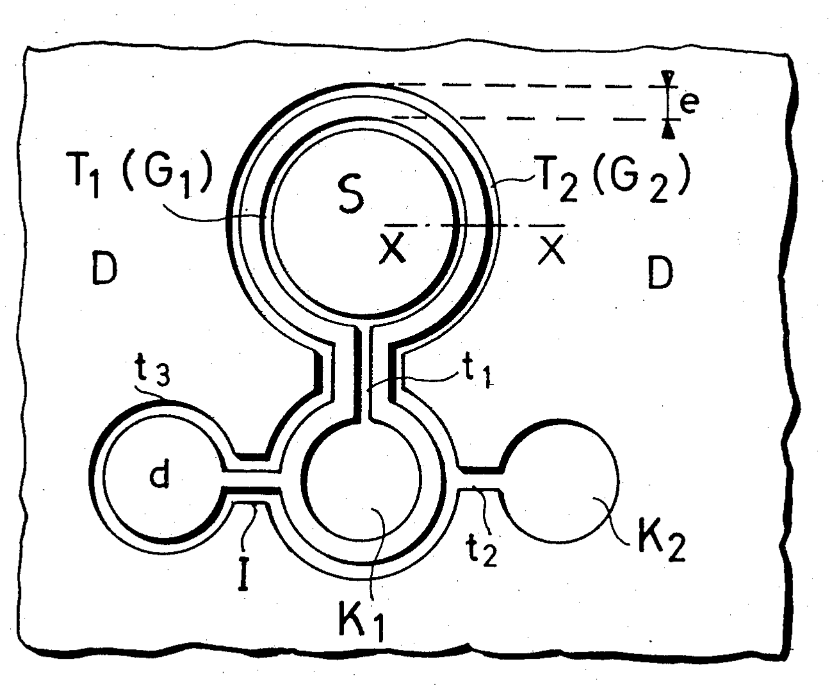
FIG. 1 shows, diagrammatically (as seen in plan) a mode of embodiment of the invention.

FIG. 1 shows, as a plan view, the surface of a semiconductor device according to the invention, according to an example of embodiment which is in no way limitative. There are shown two zones which are continuous and are engraved in the said surface to a depth of the order of 1 micron. A first zone comprises a circular trench $T_1$ (gate zone $G_1$) surrounding a circular area constituting the source S of the field effect transistor. Forming a portion of the same zone, a circular recess $K_1$ the diameter of which is 100 microns is connected with the trench $T_1$ by a trench $t_1$ running off the recess $K_1$. Located externally of the said first zone is a second zone comprising a trench $T_2$ completely surrounding the first. For this purpose, the trench $T_2$ forms two incomplete circles interconnected by rectilinear trench elements. Furthermore, through the agency of a trench $t_2$, the trench $T_2$ is connected to a circular recess $K_2$ (diameter 100 microns) and, finally, at the level of a gap I, the trench $T_2$ describes a contour $t_3$ surrounding a circular area $d$ (diameter 100 microns). The drain of the field effect transistor completely surrounds the second zone described hereinabove.

Figure 2:
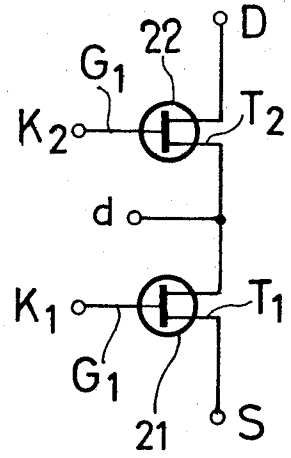
FIG. 2 is the equivalent electric wiring diagram relative to the device according to FIG. 1.

The purpose of the regions $K_1$, $K_2$ and $d$ will be more clearly appreciated from FIG. 2. It will be seen that the device of FIG. 1 is equivalent to field effect transistors 21 and 22 localised at the levels of the trenches $T_1$ and $T_2$, having respectively further electrodes, according to the following table:

| Transistor | Source | Gate | Drain |
|---|---|---|---|
| 21 ($T_1$) | S | $G_1$ ($K_1$) | $d$ |
| 22 ($T_2$) | $d$ | $G_2$ ($K_2$) | D |

These two transistors are connected in series and the area $d$ permits effecting of an electrical connection to their common electrode, as currently practised when one of the transistors serves for charging the other.

However, the device may be considered to be a single transistor having two control gates. In this case, the area $d$ will not generally be utilised.

Figure 3:
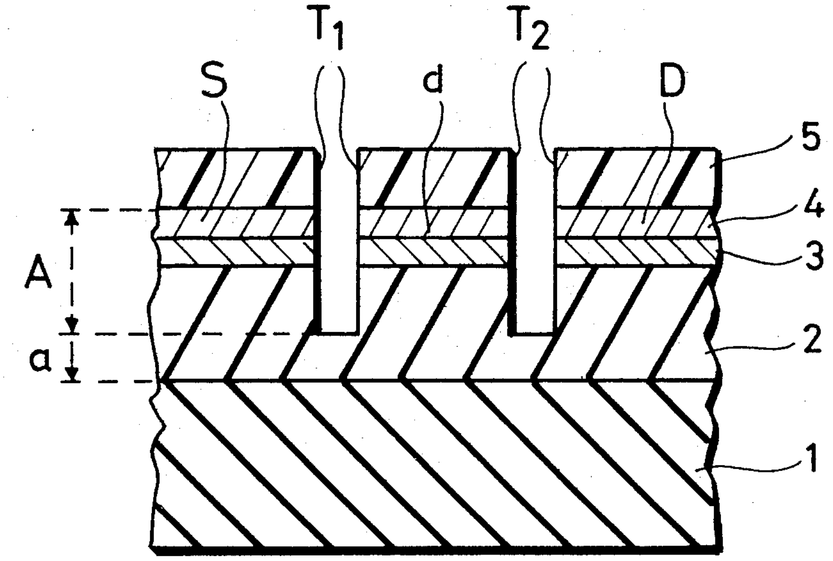
FIGS. 3 and 4 are diagrammatic sections, taken along the line X—X on the plane of FIG. 1, and showing two stages of manufacture of FIG. 5.
Figure 4:
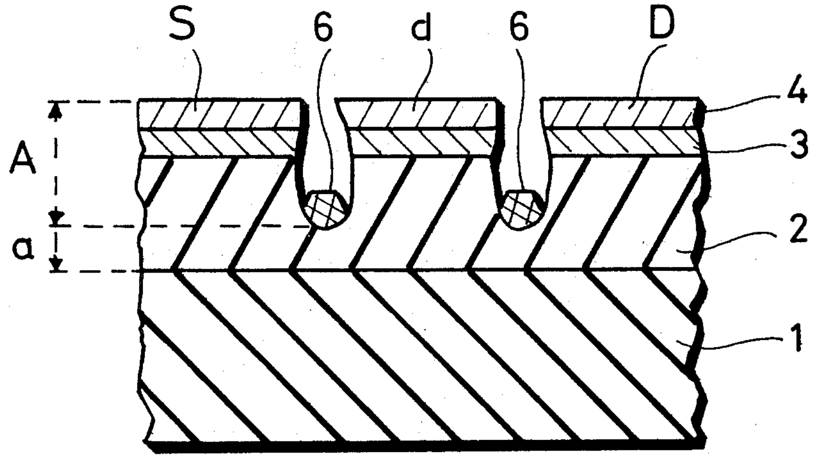

FIG. 3 shows one of the characteristic stages in the manufacturing process of the device. A substrate 1 consisting of semi-insulating gallium arsenide (thickness of the order of 300 microns) supports an epitaxial layer 2 having a thickness of the order of 2.5 microns. The said layer is constituted by gallium arsenide containing $10^{16}$ atoms per $cm^3$ of a doping impurity of type N. On the entire surface of the said layer there have been successively deposited:

a layer 3 of a germanium-silver alloy (80 percent silver, 20 percent germanium) having a thickness of 0.2 micron, in intimate contact with the layer 2 due to previous heat treatment (1 hour at 500° C under argon);

a layer 4 of aluminum or gold, having a thickness of 0.2 micron;

a resin mask 5 cut along the zones shown in FIG. 1, in such manner as to expose the surface in the said zones.

FIG. 3 has been restricted to a partial section (line XX of the section plane in FIG. 1).

The demarcation between the regions S, $d$ and D is effected in a single operation, by ionic engraving of the trenches $T_1$, $T_2$, etc.

The width of the said trenches is of the order of 1 micron; the space separating them is of the order of 10 microns; their depth, after substracting the layer 5, is:

$$A = 1.7 \text{ to } 1.9 \text{ micron.}$$

Consequently, the channel existing in the layer 2, under the trench, has a depth of the order of 0.5 to 0.7 micron. It is known to measure the depth of the penetration of the ionic engraving by engraving, at the same time as the device, a reference sample of a semiconductor panel having the same structure and measuring, in proportion as the operation proceeds, the saturation voltage of a current in the channel of depth $a$. For $a$ = 0.5 to 0.7 micron, this saturation voltage is of the order of 3 volts.

At a subsequent stage in the manufacturing process, deposits 6 of aluminum (thickness of the order of 0.5 micron) were effected by evaporation and condensation of metallic vapours at the bottom of the trenches and recesses formed in the device. Then, the trenches and recesses were cleansed by chemical action with the aid of a mixture of sulphuric acid (80 percent) and oxygenated water (20 percent). This action leaves intact the deposits 6 and the layer 4 (arresting layer).

The exposed device is then mounted in a housing or casing and connected with the aid of fine connecting wires soldered on the device by thermocompression, to the external connecting terminals of the housing or casing.

Figure 5:
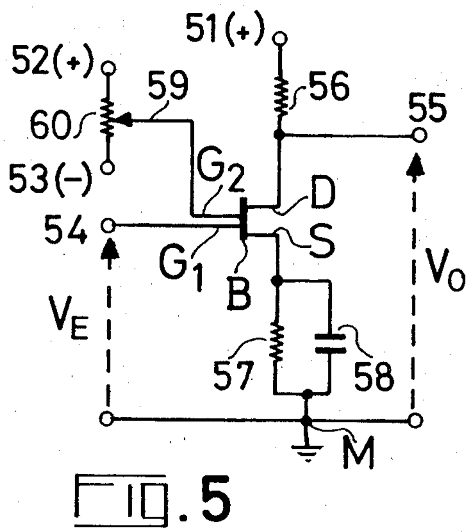
FIG. 5 is an electric wiring diagram of an example of a circuit in which the field effect transistor according to the invention may be utilised.

FIG. 5 is an electric wiring diagram of a device according to the invention. It shows four terminals D, S, $G_1$, $G_2$ and an earth. The circuit in which it is inserted is a variable gain amplifier. The gate $G_1$ is connected to a terminal 54 (input) and the drain D is connected to a terminal 55 (output) and, on the other hand, via a resistor 56, to a terminal 51 (continuous positive voltage feeding). The source S is connected to the earth M of the system via a cell comprising, connected in parallel, a resistor 57 and a capacitor 58. The gate $G_2$ is connected by a slider 59 to a potentiometric resistor 60 the terminals 52 and 53 of which are connected respectively to the positive and negative terminals of a source of dc current.

The mode of functioning is as follows.

An input voltage $V_E$ is applied between the terminal 54 and the earth M; there is recovered between the terminal 55 and the earth M and output voltage $V_O$ amplified with an amplification coefficient depending on the position of the slider 59. In this way, there is achieved adjustable gain amplification.

The advantages of the invention are particularly evident in a system such as that shown in FIG. 5, wherein the gate $G_2$ is at earth potential, in the case of the device according to FIG. 1. Practically speaking, in the case of the field effect transistor, the result is that the amplification gain is considerable and furthermore it is kept at high frequency, due to the small inter-electrode capacities.

Among the further interesting applications of the device according to the invention, mention may be made of:

the continuous control of the gain of an amplifier;

the modulation of the output signal by the action on the signal applied to the first gate of a further signal applied to the second gate;

low-noise amplification;

frequency changing;

differential amplification with balancing by one of the two gates;

the transformation of the dc document to chopped high frequency current;

the production of resistors dependent of two independent parameters embodied by two separate voltages acting on each of the gates;

the dimensions previously indicated for the recesses $K_1$ and $K_2$ are not absolutely necessary. In particular, their diameter may be smaller than 100 microns. A second (coarse) masking comprising 100 microns apertures makes it possible to form connection recesses with the aid of selective chemical attack.

What I claim is:

1. A field effect transistor comprising: a semi-insulating semiconductor substrate; a semiconductive layer having a predetermined type of conductivity, overlaying said substrate and having a top surface; two ohmic contacts constituted by a metallic layer carried by said semiconductive layer top surface, said contacts constituting the source and the drain of said field effect transistor; a first trench of a predetermined width formed in said semiconductive layer extending downwardly through said metallic layer and said top surface and terminating within said semiconductive layer, a first recess of a width substantially greater than the predetermined width formed in said semiconductive layer and communicating with said first trench, at least one second trench of a particular width formed within said semiconductive layer extending downwardly through the metallic layer and said top surface and terminating within said semiconductive layer, a second recess of a width substantially greater than the particular width formed in said semiconductive layer and communicating with said second trench, whereby the bottom of said trenches and recesses lie above said substrate, metallic deposits formed in a bottom portion of said trenches below said semiconductive layer top surface and forming at least two separate control gates of said field effect transistor, metallic deposits formed in said recesses which contact the metallic deposits in said trenches and form connection means for permitting external electrical connection to said two separate control gates, said first trench surrounding said source, and said second trench surrounding said first trench and said first recess, said drain surrounding said second trench and said second recess so that a portion of the metal layer on the top surface of the semiconductive layer is separated from other portions of the metal layer and overlies the top surface of the semiconductive layer between said first and second trenches.

2. A field effect transistor according to claim 1, wherein said semiconductor substrate and said semiconductive layer are constituted by gallium arsenide.

3. A field effect transistor according to claim 1, wherein the said ohmic contacts are constituted by a first and a second metallic layer, deposited successively on the said semiconductive layer, the first metallic layer being constituted by an alloy of silver (approximately 80 percent) and germanium (approximately 20 percent), said first layer forming a metal alloy with said semiconductive layer and said second metallic layer being constituted by pure aluminium or pure gold.

4. A field effect transistor according to claim 1, wherein the following orders of magnitude are respected with regard to the dimensions of:

each trench of the gate: width and depth of the order of 1 micron;

the semiconductive layer remaining below each trench: thickness of the order of 0.5 to 0.7 micron.

* * * * *